United States Patent
Han et al.

(10) Patent No.: US 8,319,521 B1
(45) Date of Patent: Nov. 27, 2012

(54) SAFE PROGRAMMING OF KEY INFORMATION INTO NON-VOLATILE MEMORY FOR A PROGRAMMABLE LOGIC DEVICE

(75) Inventors: Wei Han, Hillsboro, OR (US); Barry Britton, Hillsboro, OR (US); Eric Lee, Hillsboro, OR (US); Zheng Chen, Hillsboro, OR (US); Warren Juenemann, Hillsboro, OR (US); Mose Wahlstrom, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/076,300

(22) Filed: Mar. 30, 2011

(51) Int. Cl.
*H03K 19/177* (2006.01)
*H01L 25/00* (2006.01)

(52) U.S. Cl. ............................ 326/41; 326/38; 326/39

(58) Field of Classification Search .............. 326/37–41, 326/47
See application file for complete search history.

(56) References Cited

U.S. PATENT DOCUMENTS

| | | | |
|---|---|---|---|
| 5,440,515 A | 8/1995 | Chang et al. | |
| 6,185,128 B1 | 2/2001 | Chen et al. | |
| 6,342,807 B1 * | 1/2002 | Nolan et al. | 327/525 |
| 6,879,535 B1 | 4/2005 | Perisetty | |
| 6,891,774 B1 | 5/2005 | Abdollahi-Alibeik et al. | |
| 7,131,043 B1 | 10/2006 | Dastidar | |
| 7,266,028 B1 | 9/2007 | Ghosh Dastidar | |
| 7,411,417 B1 | 8/2008 | Rutledge et al. | |
| 7,463,060 B1 | 12/2008 | Whitten et al. | |
| 7,484,144 B2 | 1/2009 | Han et al. | |
| 7,623,378 B1 * | 11/2009 | Wahlstrom et al. | 365/185.04 |
| 7,630,259 B1 | 12/2009 | Han et al. | |
| 7,646,658 B2 | 1/2010 | Chen et al. | |
| 7,656,193 B1 | 2/2010 | Whitten et al. | |
| 2010/0061152 A1 | 3/2010 | De Caro et al. | |

* cited by examiner

*Primary Examiner* — Shawki Ismail
*Assistant Examiner* — Jany Tran
(74) *Attorney, Agent, or Firm* — Haynes and Boone, LLP

(57) ABSTRACT

A programmable logic device (PLD) is disclosed that includes a non-volatile memory; a shadow register; and a data shift register (DSR) configurable to receive control information from an external programming tool, wherein the DSR is configured to shift the control information into the shadow register if the PLD is in a first programming mode, the PLD being configurable to operate in the first programming mode using the control information stored in the shadow register without the control information being stored in the non-volatile memory.

20 Claims, 2 Drawing Sheets

SAFE PROGRAMMING OF KEY INFORMATION INTO NON-VOLATILE MEMORY FOR A PROGRAMMABLE LOGIC DEVICE

TECHNICAL FIELD

The present invention relates generally to programmable logic devices and, more particularly, to the programming of configuration data into a non-volatile memory for a programmable logic device.

BACKGROUND

A programmable logic device (PLD) requires configuration by the user before normal operation. Various programming tools exist that enable a user to shift in configuration data into the PLD to effect a desired logical function. ThereABLE are corresponding types of elements or components that are configured by the resulting stored configuration data within the PLD. The primary component being configured may be referred to as the programmable fabric—in the case of a field programmable gate array (FPGA), the programmable fabric includes a plurality of lookup-table-based logic blocks as well as an associated routing structure. The configuration data for the programmable fabric is typically stored in a volatile FPGA memory (SRAM) and is shifted into the device through a dedicated data shift register (DSR). In contrast, critical control information such as clock trim levels, encryption keys, and passwords are shifted into the device through a separate dedicated data shift register.

The critical control information is stored in a non-volatile memory such as flash or an embedded non-volatile memory such as a one-time programmable (OTP) memory. But the resulting stored information is not accessed by the configured PLD directly from the non-volatile memory. Instead, the control information is first copied into corresponding shadow registers. This is done because the shadow registers are faster to read from as opposed to reading from the non-volatile memory. Thus, the configured PLD accesses the critical information from the shadow registers (as opposed to reading the non-volatile memory) during normal operation. In addition, the contents of the non-volatile memory are thus not disturbed during normal operation. But the shadow registers are not directly programmed during configuration of a conventional PLD.

Instead, the desired control information is shifted through the dedicated data shift register into the non-volatile memory. The programming tool may then read back from the non-volatile memory to ensure that the desired information was written correctly. But there is no ability to debug the device prior to writing to the non-volatile memory. This is problematic, particularly when the non-volatile memory is a one-time programmable (OTP) memory such that the data is permanently and irreversibly written.

Accordingly, there is a need in the art for PLDs that enable testing normal operation with critical control information before the critical control information is written to non-volatile memories within the PLDs.

SUMMARY

In accordance with a first embodiment, a programmable logic device (PLD) is provided that includes a non-volatile memory; a shadow register; and a data shift register (DSR) configurable to receive configuration data from an external programming tool, wherein the DSR is configured to directly shift the configuration data into the shadow register if the PLD is in a first programming mode, the PLD being configurable to operate in the first programming mode using the configuration data stored in the shadow register without the configuration data being stored in the non-volatile memory.

In accordance with a second embodiment, a method of configuring a programmable logic device (PLD) is provided that includes shifting data into a data shift register (DSR) within the PLD from an external programming tool; shifting the data from the DSR directly into a shadow register for the PLD in a first programming mode, configuring the PLD according to a remaining configuration bitstream from the external programming tool; and operating the configured PLD in the first programming mode without shifting the data into a non-volatile memory within the PLD.

In accordance with a third embodiment, a programmable logic device (PLD), is provided that includes an IEEE 1532 in-system-configurable (ISC) input port operable to receive configuration data from an external programming tool, wherein the configuration data includes a mode control signal for controlling whether the PLD is in a first programming mode and wherein the configuration data includes control data; a data shift register (DSR) for receiving the control data from the input port if the PLD is in the first programming mode; and a shadow register configurable to receive the control data from the DSR if the PLD is in the first programming mode as determined by the mode control signal, the PLD being configurable to operate in the first programming mode using the control data stored in the shadow register without the control data being stored in the non-volatile memory.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The present invention provides a programmable logic device (PLD) that includes a shadow register programming mode. Such a mode differs from a normal programming mode for conventional PLDs in that data such as critical control information is written from an external programming tool directly into the shadow registers. In addition, the PLDs disclosed herein may include a shadow-register-to-non-volatile memory programming mode in which data written to the shadow registers is uploaded directly into a non-volatile memory. The following discussion will be directed to a field programmable logic device (FPGA) implementation but it will be appreciated that the features disclosed herein are readily applied to other types of PLDs such as complex programmable logic devices (CPLDs).

Figure 1:
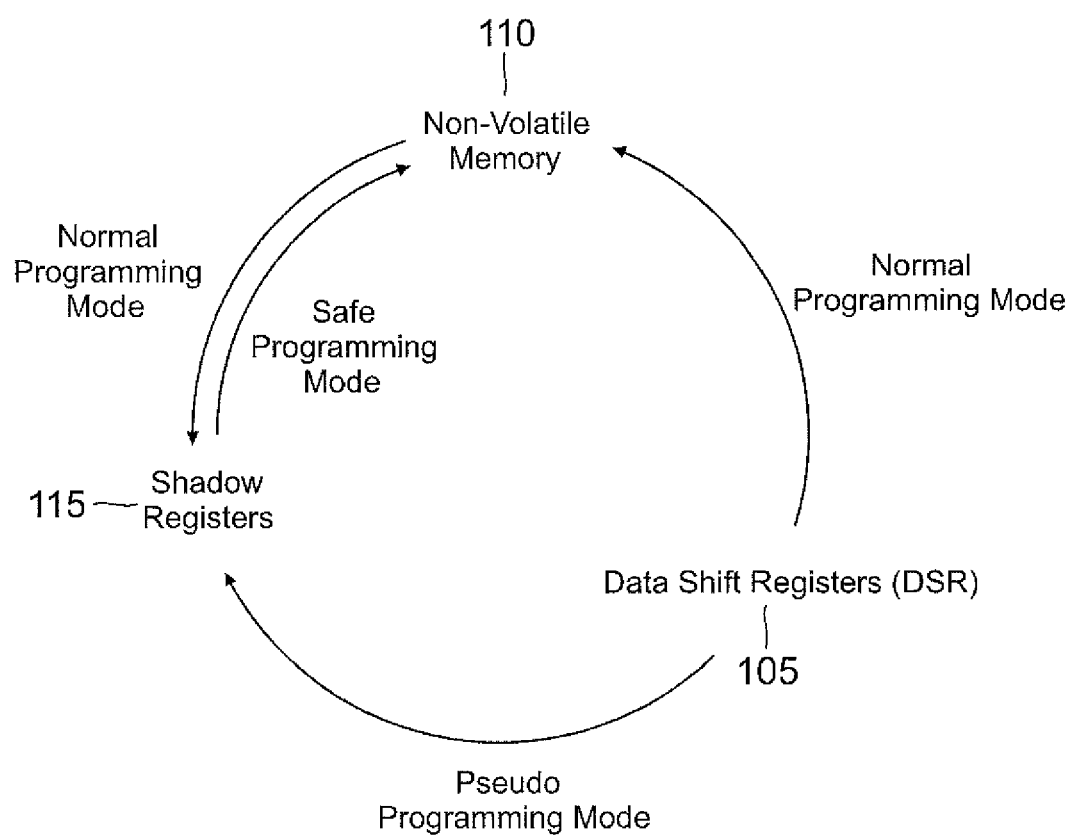
FIG. 1 is a conceptual diagram illustrating the programming modes.
Figure 2:
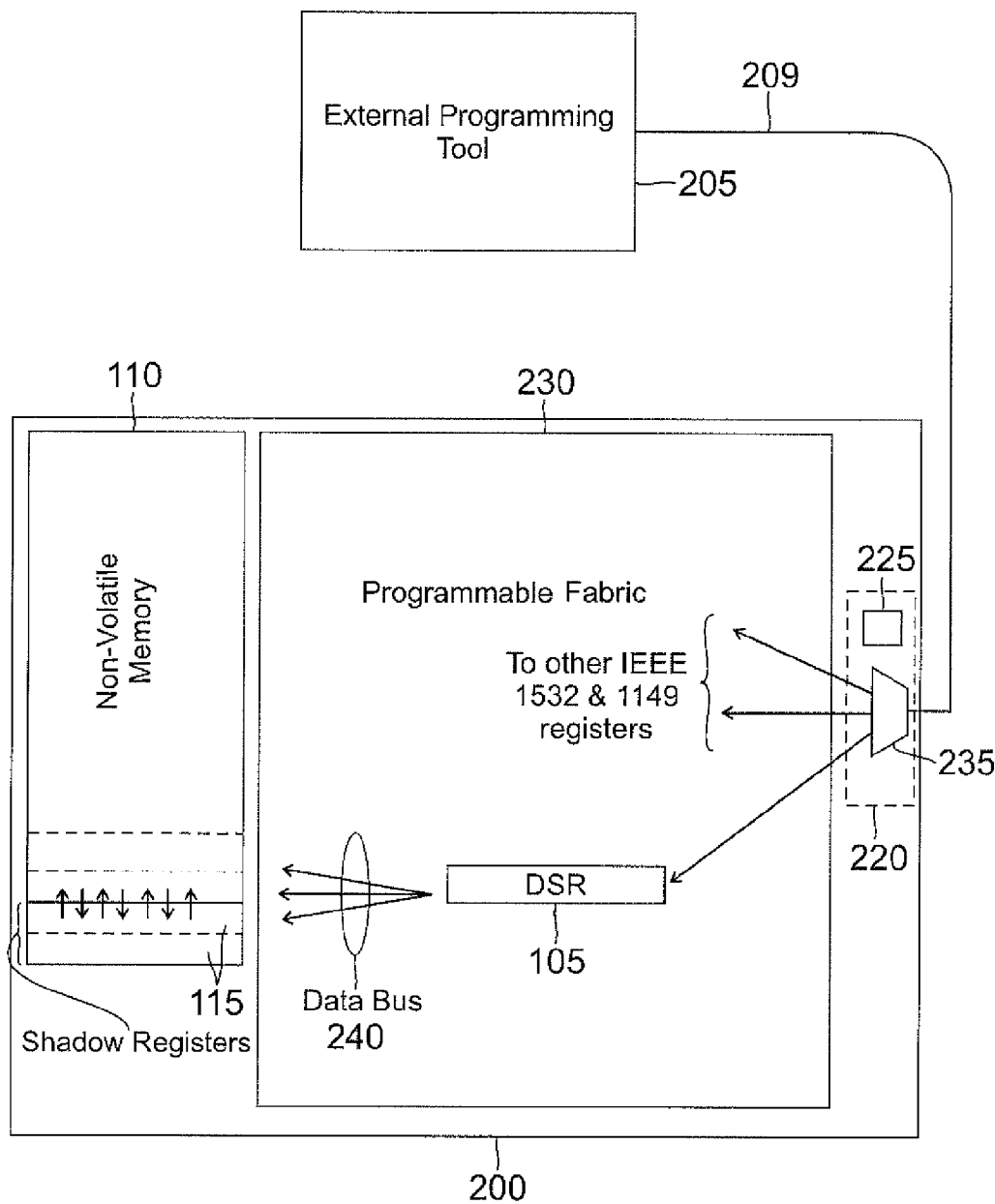
FIG. 2 is a block diagram of an FPGA configured to include a shadow register programming mode and a shadow-register-to-non-volatile-memory programming mode in accordance with an embodiment of the invention.

Turning now to the drawings, a conceptual overview of the various programming modes is provided in FIG. 1 with regard to data flows between a data shift register 105, a non-volatile memory 110, and a shadow register 115 for an FPGA (discussed further with regard to FIG. 2). The advantageous features of the programming modes enabling such data flows may be better understood by contrasting them to the conventional programming modes also illustrated in FIG. 1. An FPGA having the programmable modes of FIG. 1 includes a programmable fabric that is configured by a user according to configuration data provided by an external programming tool. The configuration data may be stored in the FPGA within a volatile memory such as a static random access memory (SRAM) and may also be stored in a non-volatile memory such as flash. In both cases, the resulting memory may be designated as a configuration memory in that the stored contents are used to program the programmable fabric. But as discussed above, there is a type of data programmed into an FPGA that may be designated as critical control information such as clock trim levels, encryption keys, and passwords. This critical control information may be stored in the flash memory or it may be stored in a separate embedded non-volatile memory such as one-time programmable (OTP) eFuse registers.

In that regard, the programming of an FPGA by an external programming tool is generally performed through a specialized JTAG port. In general, virtually all modern integrated circuits include a JTAG port so that a user may test for defaults after mounting the integrated circuit (IC) to a circuit board. In such a case, the JTAG port is coupled to a boundary scan register chain in the IC. But in the PLD arts, the JTAG port was adapted for use as a programming port as standardized by the IEEE 1532 in-system-configurable (ISC) protocol. Thus, an ISC-compliant JTAG port can be used to access the boundary scan registers but can also be used to drive various other register chains including a plurality of programming data shift registers (DSRs). Just like the boundary scan register, each programming DSR is serially loaded with data through the JTAG port, which includes logic to decode an instruction as to which register chain should be selected. The contents of a JTAG register chain can then be shifted out in parallel to a desired destination. Thus, if a user is programming the configuration SRAM, the JTAG port selects the corresponding DSR so that it may be loaded with a word of configuration data. After this word is serially shifted into the DSR, it is shifted out in parallel into a selected row for the configuration SRAM.

Similarly, a user may use the JTAG port to program the configuration flash. In that case the JTAG port selects the appropriate DSR so that it may be loaded with a word of configuration data. Because the data width for the configuration flash is typically different from the SRAM, the corresponding DSR has a different length from the one selected for the configuration SRAM. Thus, the DSR for the configuration SRAM may be designated as the SRAM DSR whereas the DSR for the configuration flash will be denoted herein simply as flash DSR or DSR 105. The length of the flash DSR matches the width of the flash such that after the flash DSR is loaded with a configuration data word, the word is shifted out in parallel into a row of the flash. The flash DSR is also typically used when control information is shifted through the JTAG port into an embedded non-volatile memory such as the OTP eFuse registers.

The conventional data flow of control information from DSR 105 to a non-volatile memory 110 is illustrated in FIG. 1. After the FPGA has been fully configured and is ready to start normal operation, the control information is transferred from non-volatile memory 110 into shadow registers 115. Thus, during normal operation, the device accesses the control information from shadow registers 115 although permanent storage is provided by non-volatile memory 110. This data flow from DSR 105 to non-volatile memory 110 and ultimately to shadow registers 115 is designated as the "normal programming mode" in FIG. 1 in that this represents the conventional mode to import such data into an FGPA. But such a mode is problematic in that non-volatile memory 110 may be an OTP memory such as eFuse registers. Although a user may ensure that the control information was written correctly to such a memory, that memory is then permanently configured with the control information. Should a user then discover during normal operation (when the control information has been shifted into shadow registers 115) that, for example, a clock trim level is improper, the entire device may need to be discarded since there is no way to amend the contents of an OTP memory.

To avoid such an undesirable result, a "pseudo programming mode" is also provided in which the control information shifted into DSR 105 is shifted out in parallel directly into shadow registers 115. Such a mode is denoted as "pseudo" programming in that the non-volatile memory is not written to yet the device is fully configured for normal operation. In other words, the full configuration bitstream is loaded onto the device but the control information is not "burned" into the non-volatile memory. The user may then test operation of the device to confirm that the control information is proper for the desired normal mode operation of the device. But if the device is powered down, the control information is then lost whereas it would be stored in non-volatile memory 110 if a conventional or "normal" programming mode had been conducted. Thus, an additional programming mode is provided, which is denoted as a "safe programming mode" in which the control information in shadow registers 115 is directly transferred into non-volatile memory 110. Such a transfer can take place after a user has verified that normal operation under the pseudo programming mode is proper such that the control information is verified as well. With the control information transferred into non-volatile memory 110, the device is fully configured such that it could be powered down yet retain its control information.

An FPGA 200 configured to implement the pseudo programming mode and safe programming mode is shown in FIG. 2. FPGA 200 includes a programmable fabric 230 that is configured as discussed above using an external programming tool 205, which drives a configuration bitstream 209 into the FPGA though an ISC 1532 port 220. Port 220 includes a configuration register 225 that stores a mode control signal downloaded by tool 205 as part of configuration bitstream 209. For example, the mode control signal could be a three-bit long signal to accommodate an indication of which of the three programming modes (pseudo, safe, and normal as discussed with regard to FIG. 1) is being implemented by FPGA 200. As known in the ISC arts, port 220 includes a de-multiplexer 235 to distribute bitstream 209 to the appropriate IEEE 1532 or IEEE 1149 register chain. Port 220 is configured such that if control register 225 stores the mode control signal indicating that the pseudo programming mode is selected, then bitstream 209 (which will in this case be control information) is serially shifted into DSR 105. Although it is convenient for DSR 105 to be the same flash DSR also used to directly configure non-volatile memory 110 in the normal programming mode, it may be a separate DSR in some embodiments. DSR 105 is like other JTAG register chains in that it is configured to shift out its contents in parallel to a data bus 240, which is also controlled by port 220 to direct the shifted-out-in-parallel data contents to the desired address. For the pseudo programming mode, bus 240 is controlled such that the contents of DSR 105 are shifted directly into a shadow register 115. FPGA 200 includes a plurality of shadow registers that may be so selected. For example, a user could download a clock trim into one shadow register and an encryption key into another shadow register. After FPGA 200 has had its programmable fabric and shadow registers configured in the pseudo programming mode, the user may then test whether the device acts as it was intended by the user for normal operation.

Should the device act appropriately, the mode control signal may be changed to indicate selection of the safe programming mode and the resulting mode control signal stored by control register 225. The contents of shadow registers 115 are then shifted into non-volatile memory 110, which can be, for example, a flash memory or an OTP memory. It is convenient if the length of shadow registers 115 match a row width for memory 110 should memory 110 be the FPGA's flash memory used to store configuration data. OTP memory may not share this width in which case any unnecessary contents of shadow registers 115 would comprise don't care values.

FPGA 200 could also practice a conventional normal programming mode if the mode control signal is set appropriately. Memory 110 would thus be representing a flash memory. In the normal programming mode, DSR 105 (assuming the same DSR is used for normal and pseudo programming modes) would shift its contents in parallel onto data bus 240, which would be controlled by port 220 such that the data destination is an appropriate row within flash 110. During a subsequent normal operation of the configured device, the row contents of flash 110 would be shifted into the appropriate shadow register 115. Thus, FIG. 2 illustrates opposing arrows between shadow registers 115 and memory 110 in that depending upon the selected mode, the data flow between these components is reversed.

The above-described embodiments of the present invention are representative of many possible embodiments. It will thus be apparent to those skilled in the art that various changes and modifications may be made to what has been disclosed without departing from this invention. The appended claims encompass all such changes and modifications as fall within the true spirit and scope of this invention.

We claim:

1. A programmable logic device (PLD), comprising:
a non-volatile memory;
a shadow register; and
a data shift register (DSR) configurable to receive control information from an external programming tool, wherein the DSR is configured to shift the control information into the shadow register if the PLD is in a first programming mode and the shadow register is configured to receive the control information from the non-volatile memory if the PLD is in a second programming mode.

2. The PLD of claim 1, wherein the shadow register is configurable to shift the control information into the non-volatile memory if the PLD is in a third programming mode.

3. The PLD of claim 1, wherein the DSR is configurable to shift the control information into the non-volatile memory if the PLD is in the second programming mode.

4. The PLD of claim 1, wherein the DSR is configured to serially shift in the control information and to shift out the control information in parallel to the shadow register.

5. The PLD of claim 1, further comprising a programmable fabric configurable according to a configuration bitstream from the external programming tool.

6. The PLD of claim 1, wherein a length of the shadow register matches a width for the non-volatile memory, the non-volatile memory being a flash memory.

7. The PLD of claim 1, wherein the non-volatile memory is a one-time programmable (OTP) memory.

8. The PLD of claim 1, wherein the DSR is configured to shift the control information directly into the shadow register if the PLD is in the first programming mode.

9. A programmable logic device (PLD), comprising:
a non-volatile memory;
a shadow register;
a data shift register (DSR) configurable to receive control information from an external programming tool, wherein the DSR is configured to shift the control information into the shadow register if the PLD is in a first programming, the PLD being configurable to operate in the first programming mode using the control information stored in the shadow register without the control information being stored in the non-volatile memory; and
an input port to receive the control information, the input port including a de-multiplexer configurable to select the DSR such that the control information is shifted from the external programming tool through de-multiplexer and into the DSR.

10. The PLD of claim 9, wherein the input port is an IEEE 1532 in system configurable (ISC) input port.

11. The PLD of claim 10, wherein the input port includes a control register that stores a programming control signal to control whether the PLD is in the first programming mode.

12. A method of configuring a programmable logic device (PLD), comprising:
within the PLD, configuring a de-multiplexer to select a data shift register (DSR);
shifting data through the de-multiplexer and into the DSR from an external programming tool;
shifting the data from the DSR into a shadow register for the PLD in a first programming mode,
configuring the PLD according to a remaining configuration bitstream from the external programming tool; and
operating the configured PLD in the first programming mode without shifting the data into a non-volatile memory within the PLD.

13. The method of claim 12 further comprising:
shifting the data from the external programming tool into the DSR; and
shifting the data from the DSR into the non-volatile memory in a second programming mode for the PLD.

14. The method of claim 13, further comprising:
determining if the configured PLD operated in the first programming mode as desired; and
if the configured PLD operated as desired, shifting the data from the shadow register into the non-volatile memory in a third programming mode for the PLD.

15. The method of claim 13 further comprising:
shifting the data from the non-volatile memory into the shadow register in the second programming mode for the PLD.

16. The method of claim 12, wherein the data and the configuration bitstream are shifted into the de-multiplexer through an IEEE 1532 ISC input port for the PLD.

17. The method of claim 16, further comprising:
   storing a mode control signal in a control register for the input port to control whether the PLD is in the first programming mode.

18. The method of claim 12, wherein shifting the data into the DSR comprises serially shifting the data.

19. The method of claim 12, wherein shifting the data from the shadow register into the non-volatile memory comprises shifting the data in parallel.

20. A programmable logic device (PLD), comprising:
   non-volatile memory;
   an IEEE 1532 in system configurable (ISC) input port operable to receive configuration data from an external programming tool, wherein the configuration data includes a mode control signal for controlling whether the PLD is in a first programming mode and wherein the configuration data includes control data;
   a data shift register (DSR) for receiving the control data from the input port if the PLD is in the first programming mode; and
   a shadow register configured to receive the control data from the DSR if the PLD is in the first programming mode and configured to receive the control data from the non-volatile memory if the PLD is in a second programming mode.

* * * * *